(12) United States Patent
Guyton

(10) Patent No.: US 8,847,637 B1
(45) Date of Patent: Sep. 30, 2014

(54) TIME-INTERLEAVED MULTI-MODULUS FREQUENCY DIVIDER

(75) Inventor: Matthew C. Guyton, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 378 days.

(21) Appl. No.: 13/479,471

(22) Filed: May 24, 2012

(51) Int. Cl.
| H03K 21/00 | (2006.01) |
| H03K 23/00 | (2006.01) |
| H03K 25/00 | (2006.01) |
| H03K 23/66 | (2006.01) |
| H03K 23/58 | (2006.01) |

(52) U.S. Cl.
CPC ............. *H03K 23/58* (2013.01); *H03K 23/667* (2013.01)
USPC .......................................... 327/115; 327/117

(58) Field of Classification Search
USPC ................................................ 327/115, 117
See application file for complete search history.

(56) References Cited

U.S. PATENT DOCUMENTS

| 7,429,944 | B1 * | 9/2008 | Nairn ............................. 341/155 |
| 7,756,487 | B2 * | 7/2010 | Lerner et al. .................... 455/76 |
| 2006/0091928 | A1 * | 5/2006 | Kapur ............................ 327/298 |
| 2008/0055010 | A1 * | 3/2008 | Lerner et al. ..................... 331/37 |
| 2008/0231338 | A1 * | 9/2008 | Nairn ............................. 327/292 |
| 2012/0313817 | A1 * | 12/2012 | Underbrink et al. ...... 342/357.72 |
| 2013/0321190 | A1 * | 12/2013 | Lesso et al. .................... 341/158 |
| 2014/0184281 | A1 * | 7/2014 | Danny et al. ................... 327/115 |

OTHER PUBLICATIONS

Abidi, Asad A., "The Path to the Software-Defined Radio Receiver", IEEE Journal of Solid-State Circuits, May 2007, pp. 954-966.
Craninckx, Jan, and Michiel S.J. Steyaert, "A 1.75-Ghz/3-V Dual-Modulus Divide-by-128/129 Prescaler in 0.7-um CMOS", IEEE Journal of Solid-State Circuits, Jul. 1996, pp. 890-897.
Pamarti, Sudhakar, et al., "A Wideband 2.4-Ghz Delta-Sigma Fractional-N PLL With 1-Mb/s In-Loop Modulation", IEEE Journal of Solid-State Circuits, Jan. 2004, pp. 49-62.
Shui, Tao, et al., "Mismatch Shaping for a Current-Mode Multibit Delta-Sigma DAC", IEEE Journal of Solid-State Circuits, Mar. 1999, pp. 331-338.
Vaucher, Cicero S., et al., "A Family of Low-Power Truly Modular Programmable Dividers in Standard 0.35-um CMOS Technology", IEEE Journal of Solid-State Circuits, Jul. 2000, pp. 1039-1045.
Vogel, Christian, et al., "Spectral Shaping of timing Mismatches in Time-Interleaved Analog-to-Digital Converters", IEEE International Symposium on Circuits and Systems, 2005, pp. 1394-1397.

* cited by examiner

*Primary Examiner* — Adam Houston
(74) *Attorney, Agent, or Firm* — Schmeiser, Olsen & Watts, LLP; William G. Guerin

(57) ABSTRACT

Described are a multi-modulus frequency divider and event counter that are based on time-interleaved signals generated from a received signal. For the frequency divider, each time-interleaved clock signal generated from a received clock signal is provided to a bit counter and the output signal from each bit counter is provided to a multiplexer. A multiplexer selection module controls over time which one of the output signals from the bit counters is presented at the output of the multiplexer. The transition frequency of the bits in the time-interleaved clock signals allows various circuit components such as the bit counters to be implemented as CMOS components. Thus the frequency divider is more power-efficient than conventional frequency divider circuits operating at high clock frequencies.

23 Claims, 6 Drawing Sheets

| $f_{in}$ period | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| Rising edge | | $I$ | $Q$ | $I$ | $Q$ | $I$ | $Q$ | $I$ | $Q$ | $I$ | $Q$ | $I$ | $Q$ | $I$ | $Q$ |
| Counter A | 1 | 0 | → | → | 1 | 0 | → | → | 1 | 0 | → | → | 1 | 0 | → |
| Counter B | 1 | 1 | 0 | → | → | 1 | 0 | → | → | 1 | 0 | → | → | 1 | 0 |
| Counter C | 1 | 1 | 1 | 0 | → | → | 1 | 0 | → | → | 1 | 0 | → | → | 1 |
| Counter D | 1 | 1 | 1 | 1 | 0 | → | → | 1 | 0 | → | → | 1 | 0 | → | → |
| MUXSEL | A | A | B | B | B | B | B | C | C | C | C | C | D | D | D |
| OUTPUT | 1 | 0 | 0 | → | → | 1 | 0 | 0 | → | → | 1 | 0 | 0 | → | → |

US 8,847,637 B1

TIME-INTERLEAVED MULTI-MODULUS FREQUENCY DIVIDER

GOVERNMENT RIGHTS IN THE INVENTION

This invention was made with Government support under Grant No. FA8721-05-C-0002 awarded by the US Air Force. The Government has certain rights in this invention.

FIELD OF THE INVENTION

The present invention relates generally to frequency dividers and event counters. More particularly, the invention relates to a fast power-efficient frequency divider that is based on multiple power-efficient time-interleaved bit counters.

BACKGROUND

Frequency dividers are commonly used in frequency synthesizers. For example, frequency synthesizers are used to generate tuning frequencies for wireless transmitters and receivers. A typical frequency divider receives an input signal at one frequency and produces an output signal at a lower frequency.

Frequency dividers are often based on the use of flip-flops to count periods of an input signal. Generally, the circuitry associated with the least significant bits (LSBs) has a higher transition frequency and the circuitry associated with the most significant bits (MSBs) has a lower transition frequency. Despite the lower transition frequency, the MSB circuitry may still require fast transition times and therefore may not be able to be implemented with lower speed components.

If the input signal to a frequency divider based on flip-flop circuitry is high frequency (e.g., greater than 2 GHz), the flip-flops are implemented in high speed circuitry such as current-mode logic (CML) (or source-coupled logic (SCL)) circuitry. Although high speed, CML circuits are not power efficient because the circuits require a static bias current that constantly consumes power.

SUMMARY

In one aspect, the invention features a multi-modulus frequency divider that includes a time-interleaved multi-clock generator, a plurality of bit counters, a multiplexer and a multiplexer selection module. The time-interleaved multi-clock generator is configured to generate a plurality of time-interleaved clock signals from a received clock signal. Each bit counter has an input in communication with the time-interleaved multi-clock generator to receive a respective one of the time-interleaved clock signals. Each bit counter also has an output to provide a counter output signal. The multiplexer has a multiplexer output and a plurality of multiplexer inputs each in communication with the output of a respective one of the bit counters. The multiplexer selection module is in communication with the multiplexer and generates a selection signal based on a divider ratio. The selection signal controls which one of the counter output signals at the multiplexer inputs is provided to the multiplexer output.

In another aspect, the invention features a method of generating a frequency-divided signal. The method includes generating a plurality of time-interleaved clock signals based on a reference clock signal. Each time-interleaved clock signals has a frequency that is less than a frequency of the reference signal. A divided time-interleaved clock signal is generated from each of the time-interleaved clock signals. A first one of the divided time-interleaved clock signals is provided at a circuit output during a first cycle of an input signal and a second one of the divided time-interleaved clock signals is provided at the circuit output during a second cycle of the input signal. The second one of the divided time-interleaved clock signals is determined from the plurality of divided time-interleaved clock signals according to a divider ratio.

In yet another aspect, the invention features a time-interleaved event counter that includes a demultiplexer, a plurality of bit counters and a count sum module. The demultiplexer has a demultiplexer input to receive an event signal having a plurality of events. The demultiplexer generates, at a plurality of demultiplexer outputs, a plurality of time-interleaved event signals during a counting interval. Each event in the event signal is distributed into only one of the time-interleaved event signals. Each bit counter has a counter input in communication with one of the demultiplexer outputs to receive a respective one of the time-interleaved event signals and a counter output to provide a count value. The count sum module has a plurality of inputs each in communication with a respective one of the counter outputs. The count sum module also has an output to provide a total count value according to a sum of the count values at an expiration of the counting interval.

In still another aspect, the invention features a method of counting events. The method includes generating a plurality of time-interleaved event signals from an event signal. Each event in the event signal is included in only one of the time-interleaved event signals. The method further includes, for each of the time-interleaved event signals, counting a number of events during a counting interval to generate a count value. A number of events in the event signal during the counting interval is determined as a sum of the count values after expiration of the counting interval.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

The invention relates to a multi-modulus frequency divider and an event counter that are based on generating and processing time-interleaved signals. Various circuit embodiments combine the speed benefits of CML circuits and the power efficiency of complementary metal-oxide-semiconductor (CMOS) circuits. The multi-modulus frequency divider is a critical component of a phase locked loop (PLL) based frequency synthesizer that can generate a wide range of frequencies. The wide tuning range frequency synthesizer is a useful component of a software-programmable radio.

Figure 1:
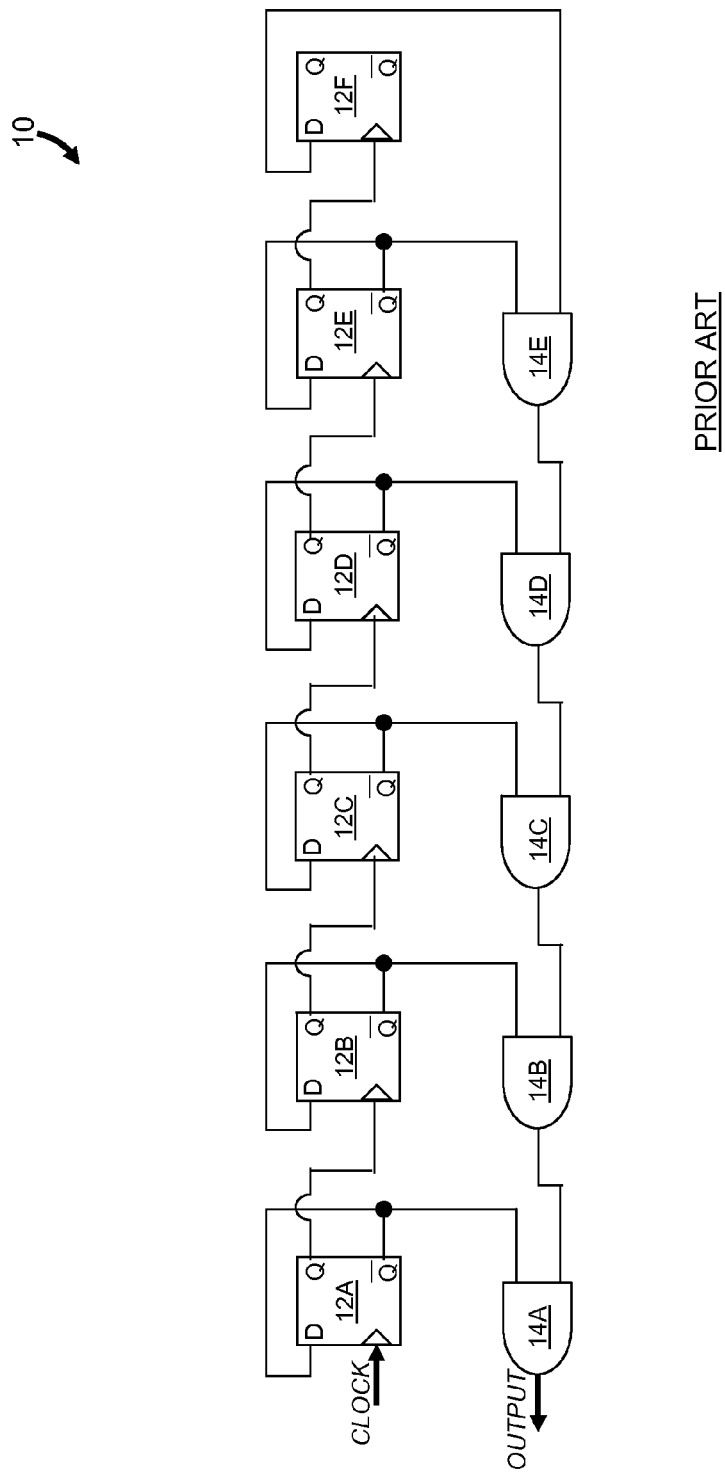
FIG. 1 shows an example of a flip-flop-based frequency divider in the form of a 6-bit asynchronous ripple counter.

FIG. 1 shows an example of a flip-flop-based frequency divider 10 in the form of a G-bit asynchronous ripple counter. The frequency divider 10 includes six flip-flops 12A to 12F and five AND gates 14A to 14E. On each rising edge of an input signal CLOCK having a frequency $f_{in}$, the counter value decrements by one. An output signal OUTPUT having a logical "1" value is generated at the output of the frequency divider 10 when the counter value reaches "000000". The subsequent rising edge of the input signal causes the value of the counter to wrap around to "111111" and the countdown of the counter value starts again. The illustrated configuration performs as a divide-by-64 frequency divider because an output pulse is generated once for every 64 periods of the input signal.

Instead of automatically loading a value of "111111" into the counter after a value of "000000" is reached, additional logic circuitry can be used to load a value of "000001". In this alternative configuration, the frequency divider 10 operates in a divide-by-2 mode, alternating between counter values of "000000" and "000001". More generally, by programming the value to be loaded into the counter, the divider ratio can be easily controlled and changed rapidly between cycles of the output signal.

Due to power efficiency, it is desirable to use flip-flops implemented in CMOS logic; however, for frequency dividers operating at high frequencies, for example, frequencies exceeding a few GHz, CML (or SCL) logic is preferred. Although higher speeds can be achieved with CML, the circuitry is less power-efficient and may not be suitable for many applications.

The present disclosure relates to time-interleaved multi-modulus frequency dividers and time-interleaved event counters that combine the speed advantages of CML circuits and the power efficiency of CMOS circuits.

Figure 2:
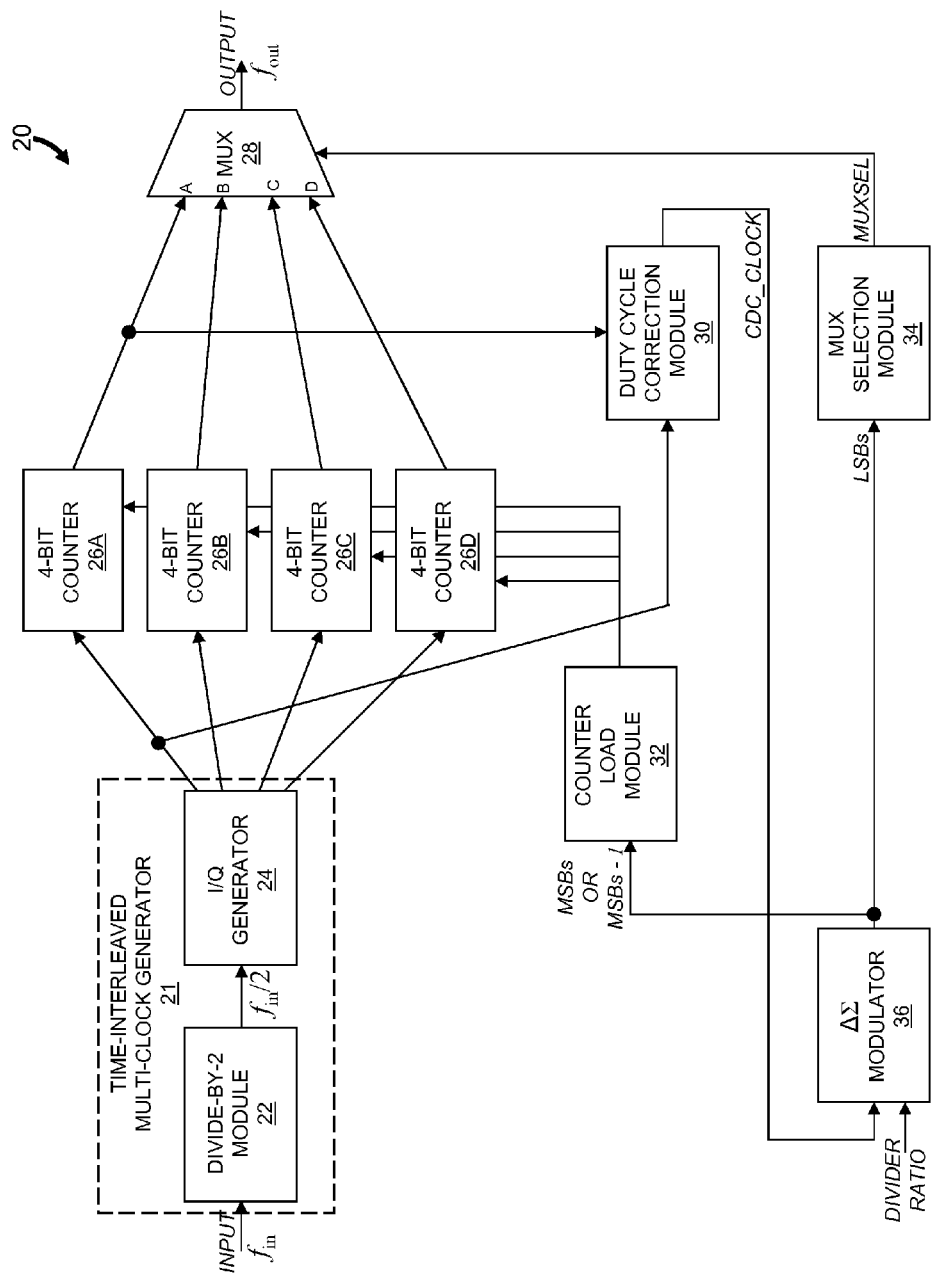
FIG. 2 shows an embodiment of a frequency divider according to the principles of the invention.

An embodiment of a frequency divider 20 according to principles of the invention is shown in FIG. 2. The frequency divider 20 includes a time-interleaved multi-clock generator 21, four 4-bit flip-flop-based ripple counters 26A to 26D, a 4:1 multiplexer MUX 28 and a duty cycle correction module 30. In this embodiment, the time-interleaved multi-clock generator 21 includes a divide-by-2 module 22 and a quadrature (I/Q) clock generator 24. The frequency divider 20 also includes a counter load module 32, a multiplexer selection module 34 and a delta-sigma modulator 36 having six output bits. The time-interleaved multi-clock generator 21 is implemented in CML whereas the other elements and modules of the frequency divider 20 are implemented in CMOS.

Figure 3:
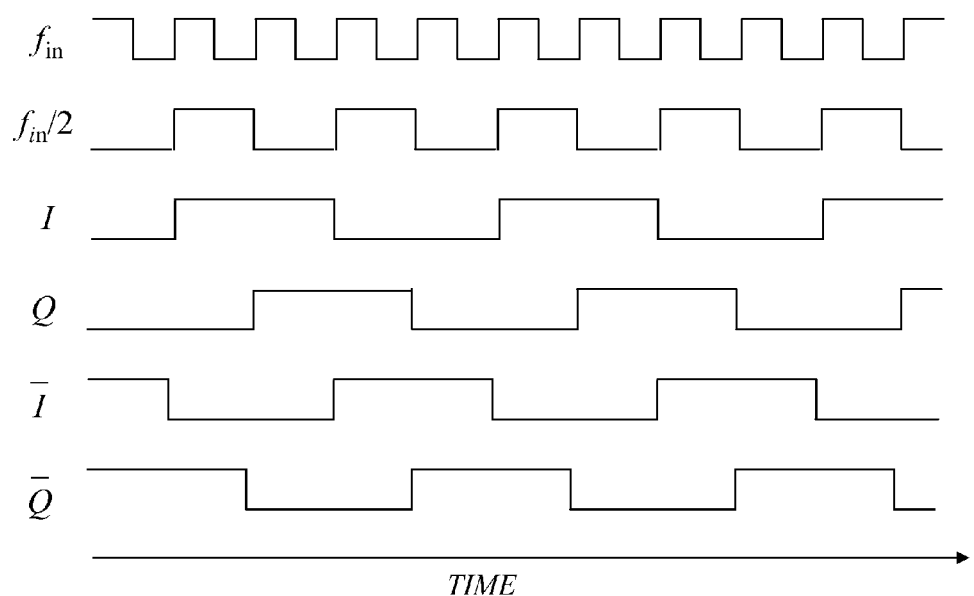
FIG. 3 is a timing diagram showing the state of various signals as a function of time during performance of an embodiment of a method of generating a frequency-divided signal according to the invention.
Figures 4, 5:
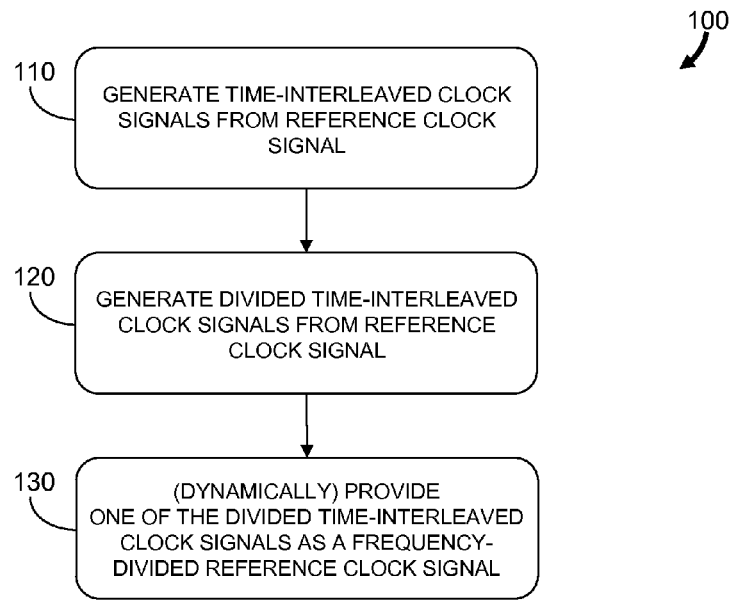
FIG. 4 is a flowchart representation of an embodiment of a method of generating a frequency-divided signal according to the invention.
FIG. 5 is a table indicating logical values of counters, a selected multiplexer channel and a logical value of an output signal as a function of time for an embodiment of a frequency divider configured for divide-by-5 operation.

Reference is also made to the timing diagram shown in FIG. 3 and the flowchart of FIG. 4 showing an embodiment of a method 100 of generating a frequency-divided signal. An input signal INPUT at a frequency $f_{in}$ is received by the divide-by-2 module and a divided signal at a frequency $f_{in}/2$ is provided to the I/Q generator 24. The I/Q generator 24 generates (step 110) four time-interleaved clock signals I, Q, $\bar{I}$ and $\bar{Q}$ each at a frequency that is one quarter of the input frequency $f_{in}$. The four time-interleaved clock signals are distributed in phase by one period of the input signal.

Each time-interleaved clock signal is received by one of the 4-bit counters 26 and decrements the count value of the respective counter 26. Thus the four counters 26 are clocked on different phases of a common signal. Although the counters 26 count down from the same programmed value, each counter 26 reaches a value of 000000 at different consecutive periods of the input signal. Thus the counters 26 generate (step 120) divided time-interleaved clock signals. Advantageously, each counter 26 is clocked at a frequency $f_{in}/4$ and therefore can be implemented in CMOS whereas a single counter clocked at the full input frequency $f_{in}$ may otherwise require implementation in CML. Many bits of the counters 26 have low transition frequencies therefore the use of CMOS instead of CML allows this time-interleaved configuration to be more power-efficient than a conventional frequency divider configured for high frequency input signals. The duty cycle correction module 30 receives one of the time-interleaved clock signals (e.g., I) and generates a corrected duty cycle clock signal CDC_CLOCK at the same frequency as the divided time-interleaved clock signals at a duty cycle of approximately 50%. The corrected duty cycle clock signal is used to clock the delta-sigma modulator 36 which in turn is used to control the counter load module 32 and multiplexer selection module 34.

During operation, the output signal OUTPUT of the frequency divider 20 is determined according to a selection signal MUXSEL generated by the multiplexer selection module 34. The selection signal controls which one of the four divided time-interleaved clock signals from the four 4-bit counters 26 to provide (step 130) at the multiplexer output during an output cycle. If the selected counter signal is the same for each output cycle, the frequency divider 20 divides the input frequency $f_{in}$ by an integer multiple of four up to a maximum divider ratio of 64. The particular divider ratio achieved by the frequency divider 20 is determined according to the value that is loaded into the 4-bit counters 26. If the multiplexer selection is rotationally advanced by one for each consecutive output cycle (i.e., A to B to C to D then repeated), the input frequency $f_{in}$ is divided by a value of 1 plus an integer multiple of four, up to a maximum possible value of 65. Stated otherwise, the divider ratio is one of the values in the set {5, 9, 13, . . . , 65} according to the particular value loaded into the counters 26.

The table presented in FIG. 5 indicates the logical values of the counters 26, the selected multiplexer channel and the logical value of the output signal OUTPUT for consecutive periods of the input signal INPUT when the frequency divider 20 is configured for divide-by-5 operation. An arrow "→" indicates a transition from one value to a subsequent value. The value at a particular time during a period associated with an arrow depends on the speed of the counter logic gates.

It follows that rotational advancements of the multiplexer selection for consecutive output cycles by two (i.e., A to C to A to C with repetition) yields possible divider ratios from the set of values {6, 10, 14, . . . , 66}. Similarly, rotational advancements of three (i.e., A to D to C to B . . . ) yields possible divider ratios from the set of values {7, 11, 15, . . . , 67}. To program a particular divider ratio, the two LSBs in the output of the delta-sigma modulator 36 are used to determine how much to advance the multiplexer selection and the four MSBs are used to determine the value to load into each 4-bit counter 26. More specifically, for output cycles where the multiplexer selection wraps past D, the MSBs are the value that is loaded into the counters 26. If the multiplexer selection does not wrap past D, the value loaded into the counters 26 is one less than the MSBs.

The full range of divider ratios that can be achieved with the frequency divider 20 includes integers from 4 to 67, inclusive. It will be recognized that other embodiments of a frequency divider based on the time-interleaving method described above can be achieved using different numbers of counters and different numbers of counter bits to obtain different divider ratios and ranges of divider ratios.

Unlike the frequency divider 10 of FIG. 1 which is based on a single 6-bit counter configuration, the frequency divider 20 of FIG. 2 alternates among four time-interleaved counters 26 to achieve a desired divider ratio. Consequently, a systematic timing error due to propagation delay differences among the four signal paths from the counters 26 to the multiplexer 28 can occur. These timing errors do not occur if the divided time-interleaved clock signal provided at the multiplexer output does not change in time. If the frequency divider 20 is used as part of a frequency synthesizer, the timing errors due to different propagation delays are evident as spurs (unwanted tones) and as an increased phase noise floor close to the output frequency of the frequency synthesizer.

Figure 6:
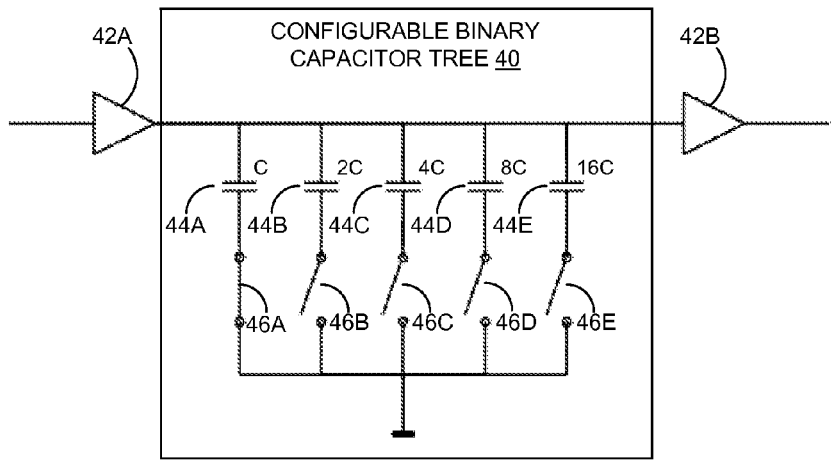
FIG. 6 illustrates a configurable binary capacitor tree that is disposed between buffers in each of the signal paths between the bit counters and multiplexer according to an embodiment of a frequency divider.

To address the potential for timing errors, a further embodiment of the frequency divider includes a configurable binary capacitor tree (e.g., a "capacitive DAC") as a variable delay element for each of the signal paths from the counters 26. FIG. 6 shows an example in which a configurable binary capacitor tree 40 is disposed between buffers 42 in each of the signal paths between the counters 26 and the multiplexer 28. Each capacitor tree 40 includes a parallel configuration of capacitors 44 coupled between the signal path and ground through a respective switch 46. The capacitors 44 and switches 46 enable a 5-bit capacitance value to be selected for the signal path. The capacitance value for each capacitance tree 40 is selected to modify the rise and fall times of the respective divided time-interleaved signal and thereby equalize the propagation delays of the four signal paths.

Other configurations and techniques can be applied to manage the differences in propagation delay. Techniques include the retiming of transitions, the shaping of the timing error and feed-forward cancellation techniques.

In one embodiment, all transitions of the output signal (at the output of the multiplexer 28) are retimed using a single flip-flop clocked by the input signal at a frequency $f_{in}$, thereby reducing or eliminating the timing errors. The achievable reduction in timing errors is dependent on the range of input frequencies.

The timing error can be shaped by modifying or removing the periodicity of the rotational advancements of the multiplexer selection. In one embodiment, the rotational direction of the counter selection is alternated from clockwise (A to B to C to D) to counterclockwise (D to C to B to A). In this manner the phase noise spurs associated with the difference in propagation delay for the different counter signal paths are removed. In another embodiment, the bit counters 26 are separated into two groups. The first group includes the counters 26 associated with the greater propagation delays and the second group includes the counters 26 associated with the lesser propagation delays. The multiplexer selection of the divided time-interleaved clock signals alternates selection between the two groups and thereby achieves a significant reduction in the phase noise. If the selection within each group is random, the phase noise is shaped to one spur at a frequency of $f_{out}/2$.

The embodiments of a multi-modulus frequency divider described above can be considered to be specific implementations of a more general configuration of a time-interleaved event counter according to principles of the invention. As used herein, an event is an occurrence of a feature in an electrical signal such as a pulse or a rising or falling transition between binary signal values. By way of example, events may be the result of occurrences of physical phenomena sensed by an electrical, magnetic or optical detector and manifested in an electrical signal generated by the detector. The time-interleaved event counter can be used for high-speed counting of events, including events that are asynchronous or non-periodic.

Figure 7:
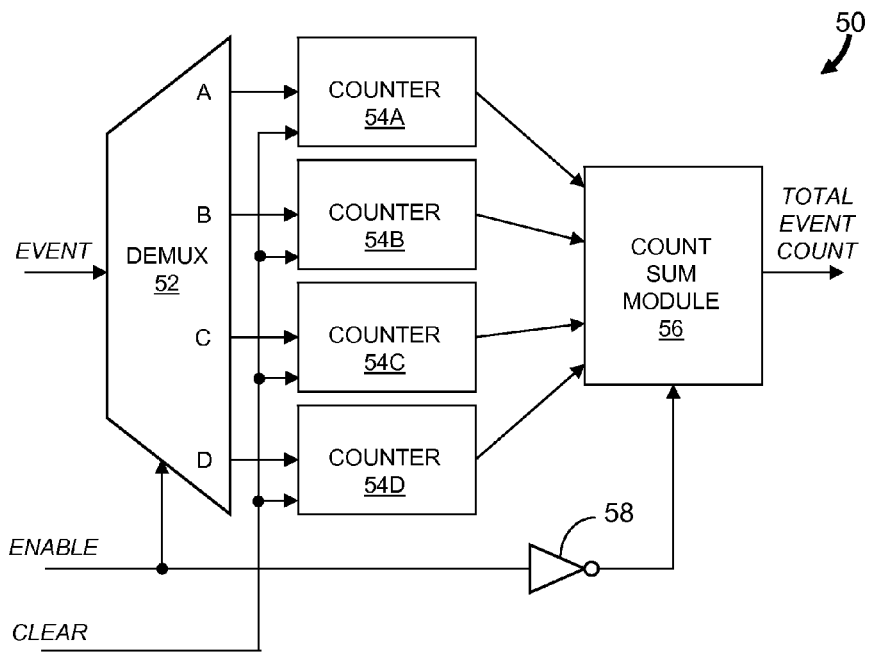
FIG. 7 illustrates an embodiment of a time-interleaved event counter according to the invention.

FIG. 7 shows one embodiment of a time-interleaved event counter 50. The event counter 50 includes a demultiplexer DEMUX 52, four bit counters 54, an event count module 56 and an inverter 58. Each bit counter 54 has an input that is in communication with one of four demultiplexer outputs and each bit counter 54 has an output that is in communication with one of four inputs of the count sum module 56.

Figure 8:
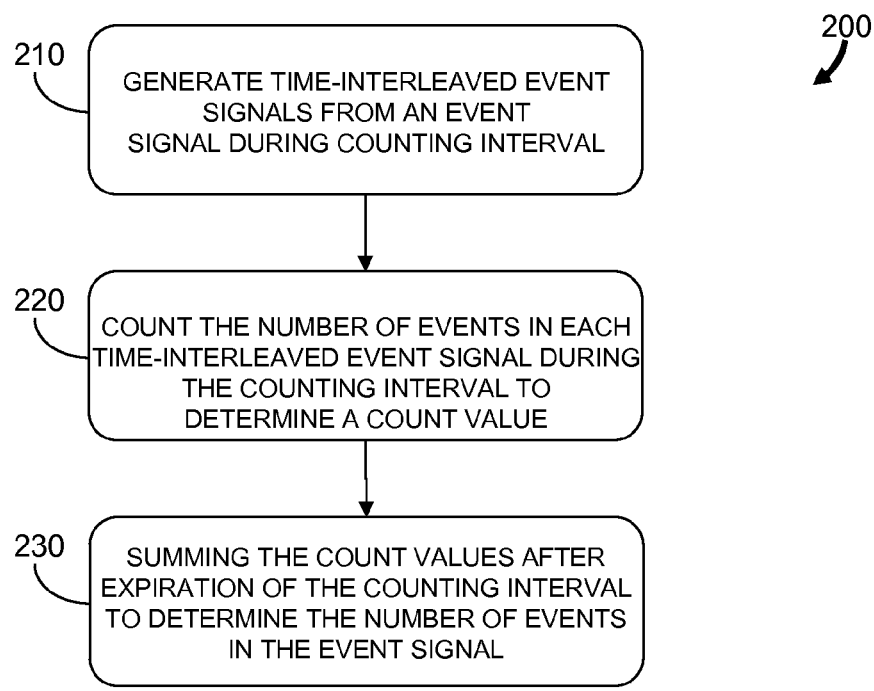
FIG. 8 is a flowchart representation of an embodiment of a method of counting events in an event signal according to the invention.

Reference is also made to FIG. 8 which shows a flowchart of an embodiment of a method 200 of counting events in an electrical event signal. An event signal EVENT received at the input of the demultiplexer 52 is demultiplexed (step 210) into four time-interleaved event signals. The events in the event signal are distributed in a round robin manner to the inputs of the four bit counters 54. More specifically, an event in the event signal is provided at demultiplexer output A and the next three events in the EVENT signal are provided sequentially to demultiplexer outputs B, C and D respectively. The distribution of subsequent events repeats sequentially through this A then B then C then D order. Thus each bit counter 54 receives a time-interleaved event signal that includes every fourth event in the event signal. The distribution of events across multiple time-interleaved event signals allows each counter 54 to count (step 220) at a slower count rate than would otherwise be possible when counting events in a single event signal. The total number of counts is determined (step 230) by summing the number of counts determined by each of the counters 54.

To initiate a counting interval, the bit counters 54 are "cleared" or set to zero before activating the demultiplexer 52 by asserting a demultiplexer control signal ENABLE. Subsequently, each counter 54 counts up from zero during the counting interval. The counting interval ends by de-asserting the demultiplexer control signal. The count sum module 56 waits until the counting interval has ended before summing the count values of the four counters 54 to determine the total event count. By way of an example, if each counter 54 is a 4-bit counter, the count sum module 56 reads four 4-bit count values and determines the sum. In the illustrated embodiment, the count sum module 56 is activated by a control signal $\overline{\text{ENABLE}}$ which is the logical inversion of the demultiplexer control signal.

While the invention has been shown and described with reference to specific embodiments, it should be understood by those skilled in the art that various changes in form and detail may be made therein without departing from the spirit and scope of the invention. For example, various embodiments disclosed above utilize four time-interleaved signals. It should be recognized that other numbers of time-interleaved signals and bit counters can be used. For example, it can be desirable to use greater numbers of time-interleaved signals and bit counters with high frequency clock signals and event signals having high event rates.

What is claimed is:

1. A multi-modulus frequency divider, comprising:
   a time-interleaved multi-clock generator configured to generate a plurality of time-interleaved clock signals from a received clock signal;
   a plurality of bit counters each having an input in communication with the time-interleaved multi-clock generator to receive a respective one of the time-interleaved clock signals, each of the bit counters having an output to provide a counter output signal;
   a multiplexer having a plurality of multiplexer inputs each in communication with the output of a respective one of the bit counters, the multiplexer having a multiplexer output; and
   a multiplexer selection module in communication with the multiplexer and generating a selection signal based on a divider ratio, the selection signal controlling which one of the counter output signals at the multiplexer inputs is provided to the multiplexer output.

2. The multi-modulus frequency divider of claim 1 wherein each of the bit counters is a multi-bit counter.

3. The multi-modulus frequency divider of claim 1 wherein the time-interleaved multi-clock generator, bit counters, multiplexer and multiplexer selection module are fabricated in complementary metal-oxide-semiconductor logic.

4. The multi-modulus frequency divider of claim 1 further comprising a delta-sigma modulator in communication with the multiplexer selection module and configured to receive a signal indicative of the divider ratio.

5. The multi-modulus frequency divider of claim 2 further comprising a counter load module in communication with each of the multi-bit counters and configured to load a counter value into each of the multi-bit counters, the counter value being determined according to the divider ratio.

6. The multi-modulus frequency divider of claim 5 further comprising a delta-sigma modulator in communication with the multiplexer selection module and the counter load module, the delta-sigma module configured to receive a signal indicative of the divider ratio.

7. The multi-modulus frequency divider of claim 1 wherein the time-interleaved clock signals have a frequency that is less than a frequency of the received clock signal.

8. The multi-modulus frequency divider of claim 1 wherein each of the time-interleaved clock signals is separated in phase from the other time-interleaved clock signals by an integer multiple of a phase difference.

9. The multi-modulus frequency divider of claim 1 wherein the time-interleaved clock signals comprise an in-phase signal, a quadrature signal, an inverted in-phase signal and an inverted quadrature signal.

10. The multi-modulus frequency divider of claim 1 wherein each of the counter output signals at the multiplexer inputs has a propagation delay, the multi-modulus frequency divider further comprising:
    a plurality of signal paths each coupling the output of one of the bit counters to a respective one of the multiplexer inputs and configured to conduct a respective one of the counter output signals; and
    a plurality of variable delay elements each in communication with a respective one of the signal paths, wherein each of the variable delay elements is adjustable to enable equalization of the propagation delays.

11. The multi-modulus frequency divider of claim 1 wherein each of the counter output signals at the multiplexer inputs has a propagation delay, the multi-modulus frequency divider further comprising:
    a plurality of signal paths each coupling the input of one of the bit counters to the time-interleaved multi-clock generator and configured to conduct a respective one of the time-interleaved clock signals; and
    a plurality of variable delay elements each in communication with a respective one of the signal paths, wherein each of the variable delay elements is adjustable to enable equalization of the propagation delays.

12. A method of generating a frequency-divided signal, the method comprising:
    generating a plurality of time-interleaved clock signals based on a reference clock signal, each of the time-interleaved clock signals having a frequency that is less than a frequency of the reference signal;
    generating a divided time-interleaved clock signal from each of the time-interleaved clock signals;
    providing a first one of the divided time-interleaved clock signals at a circuit output during a first output cycle; and
    providing a second one of the divided time-interleaved clock signals at the circuit output during a second output cycle, wherein the second one of the divided time-interleaved clock signals is determined from the plurality of divided time-interleaved clock signals according to a divider ratio.

13. The method of claim 12 wherein a number N of time-interleaved clock signals are generated and wherein the frequency of the reference clock signal is N time the frequency of the time-interleaved clock signals.

14. The method of claim 12 wherein each of the time-interleaved clock signals is separated in phase from the other time-interleaved clock signals by an integer multiple of a phase difference.

15. The method of claim 12 wherein the first one of the divided time-interleaved clock signals and the second one of the divided time-interleaved clock signals are the same divided time-interleaved clock signal.

16. The method of claim 12 wherein an input signal is frequency-divided to generate the reference clock signal.

17. A time-interleaved event counter, comprising:
    a demultiplexer having a demultiplexer input to receive an event signal having a plurality of events and generating at a plurality of demultiplexer outputs a plurality of time-interleaved event signals during a counting interval, each of the events in the event signal being distributed into only one of the time-interleaved event signals;
    a plurality of bit counters each having a counter input in communication with one of the demultiplexer outputs to receive a respective one of the time-interleaved event signals and each having a counter output to provide a count value; and
    a count sum module having a plurality of inputs each in communication with a respective one of the counter outputs and having an output to provide a total count value according to a sum of the count values at an expiration of the counting interval.

18. The time-interleaved event counter of claim 17 wherein the events comprise one of a rising edge and a trailing edge in the event signal.

19. The time-interleaved event counter of claim 17 wherein the distribution of the events in the event signal into the time-interleaved event signals is according to a round robin distribution.

20. The time-interleaved event counter of claim 17 wherein the bit counters are multi-bit counters.

21. A method of counting events, the method comprising:
generating a plurality of time-interleaved event signals from an event signal, where each of the events in the event signal is included in only one of the time-interleaved event signals;
for each of the time-interleaved event signals, counting a number of events during a counting interval to generate a count value; and
determining a number of events in the event signal during the counting interval as a sum of the count values after expiration of the counting interval.

22. The method of claim 21 wherein the events comprise one of a rising edge and a trailing edge in the event signal.

23. The method of claim 21 wherein the inclusion of the events into the time-interleaved event signals is according to a round robin distribution.

* * * * *